(12) United States Patent
Park

(10) Patent No.: US 6,968,054 B2
(45) Date of Patent: Nov. 22, 2005

(54) WIDE KEYPAD AND WIDE KEYPAD MOUNTING STRUCTURE FOR PREVENTING ESD

(75) Inventor: Sung-Sun Park, Kumi-shi (KR)

(73) Assignee: Samsung Electronics Co., Ltd., (KR)

( * ) Notice: Subject to any disclaimer, the term of this patent is extended or adjusted under 35 U.S.C. 154(b) by 850 days.

(21) Appl. No.: 09/879,578

(22) Filed: Jun. 12, 2001

(65) Prior Publication Data

US 2002/0032011 A1 Mar. 14, 2002

(30) Foreign Application Priority Data

Aug. 19, 2000 (KR) .............................. 2000-48133

(51) Int. Cl.⁷ .............................................. H04M 1/00
(52) U.S. Cl. ............. 379/368; 379/433.06; 379/433.07
(58) Field of Search ........................ 379/368, 433.06, 379/433.07

(56) References Cited

U.S. PATENT DOCUMENTS

| | | | |
|---|---|---|---|
| 5,598,469 A | * | 1/1997 | Preker .................... 379/433.07 |
| 5,877,709 A | * | 3/1999 | Ala-Lehtimaki et al. ...... 341/26 |
| 6,187,514 B1 | * | 2/2001 | Kiyosawa et al. .......... 430/320 |

* cited by examiner

*Primary Examiner*—Jack Chiang
*Assistant Examiner*—Quynh H. Nguyen
(74) *Attorney, Agent, or Firm*—Dilworth & Barrese LLP

(57) ABSTRACT

Disclosed are a wide keypad and a wide keypad mounting structure in a portable terminal. In the wide keypad, a plurality of key tops are arranged in tight contact in a matrix of rows and columns. A key film has a plurality of upper protrusions in contact with the bottom surfaces of the key tops, a plurality of lower protrusions as contact points spaced from metal domes, and recesses between the upper protrusions. A key frame is inserted into the recesses of the key film and has at least one spacer extended upward for providing space in which the key tops move up and down between the upper casing frame and the key film.

7 Claims, 5 Drawing Sheets

WIDE KEYPAD AND WIDE KEYPAD MOUNTING STRUCTURE FOR PREVENTING ESD

PRIORITY

This application claims priority to an application entitled "Wide Keypad and Wide Keypad Mounting Structure for Preventing ESD" filed in the Korean Industrial Property Office on Aug. 19, 2000 and assigned Ser. No. 2000-48133, the contents of which are hereby incorporated by reference.

BACKGROUND OF THE INVENTION

1. Field of the Invention

The present invention relates generally to a keypad for inputting information including characters and digits in a terminal, and in particular, to a wide keypad and a wide keypad mounting structure that increase a touching area for convenient key pressing and minimize static electricity introduced into the keypad.

2. Description of the Related Art

A portable terminal is a mobile station that provides radio communication services to a user by radio communication with a base station. Aside from transmission of voice or pictures, this terminal additionally provides radio communication services such as E-mail or chatting. Commonly, terminals are classified into a bar type, a flip type, and a folder type according to their outer appearances. The terminal is usually comprised of a data input device, an LCD for displaying input data, a voice transmitter/receiver, and an antenna device. A typical terminal is illustrated in FIG. 1. Referring to FIG. 1, the terminal includes a main body 10. On the main body 10 are provided an antenna device 11, an incoming call lamp 12 for visually indicating the reception of a call, an earpiece 13 as a voice receiver, an LCD 14 for displaying input data, a keypad 15 having a plurality of keys for entering information of characters and digits, and a microphone 16 as a voice transmitter.

As shown in FIG. 2, the data input device includes the keypad 15 mounted in an upper casing frame 101 of the main body 10. The keypad 15 has a plurality of keys 150, a sheet portion 151 for integrally connecting the keys 150, contact point protrusions 152 protruding from the lower surface of the sheet portion 151, and engaging portions 153 for restricting the upward movement of the keys 150. This keypad 15 is fabricated by film forming. The ends 150a of the keys 150 are even with or higher than the surface 101a of the upper casing frame 101. As many holes 101b as there are keys 150 are formed in the upper casing frame to fix the keys 150.

A user presses the top ends 150a of keys 150 to enter data. Metal domes, carbon contact points, and a PCB (Printed Circuit Board) are located under the contact point protrusions 152, which are well known and thus will not be described herein.

Currently, terminals are being developed toward small size, lightweight, and improved portability. However, the size of keys is an obstacle to miniaturization of terminals. Though the keys of a keypad should be scaled down in size to miniaturize a terminal, keys that are too small cause a user inconvenience in key pressing. On the other hand, enlarged keys will render data entry convenient but increase the main body of the terminal. Furthermore, when static electricity is introduced through holes into which the keys are inserted in the frame, the conventional terminal encounters the problem of ESD (ElectroStatic Discharge).

SUMMARY OF THE INVENTION

It is, therefore, an object of the present invention to provide a wide keypad and a wide keypad mounting structure, which allow keys to be enlarged and prevent ESD.

It is another object of the present invention to provide a wide keypad and a wide keypad mounting structure, which maximize the size of keys and contribute to miniaturization of a main body.

The foregoing and other objects are achieved by a wide keypad and a wide keypad mounting structure in a portable terminal. In the wide keypad, a plurality of key tops are arranged in tight contact in a matrix of rows and columns. A key film has a plurality of upper protrusions in contact with the bottom surfaces of the key tops, a plurality of lower protrusions as contact points spaced from metal domes, and recesses between the upper protrusions. A key frame is inserted into the recesses of the key film and has at least one spacer extended upward for providing space in which the key tops move up and down between the upper casing frame and the key film.

In a wide keypad mounting structure, an upper casing frame has an inner surface treated with a conductive material. A plurality of key tops are fixed in tight contact with each other in a matrix of rows and columns within the upper casing frame. A key film has a plurality of upper protrusions in contact with the bottom surfaces of the key tops, a plurality of lower protrusions as contact points spaced from metal domes, and recesses between the upper protrusions, and is bonded to the bottom surfaces of the key tops. A conductive key frame is inserted into the recesses of the key film and has at least one spacer extended upward for providing space in which the key tops move up and down between the upper casing frame and the key film. An engaging boss is extended from a predetermined portion of the bottom surface of the upper casing frame to be engaged with a main board by a screw and its surface is treated with a conductive material to contact the key frame.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described hereinbelow with reference to the accompanying drawings. In the following description, well-known functions or constructions are not described in detail since they would obscure the invention in unnecessary detail.

It is to be noted that while a wide keypad and a wide keypad mounting structure according to an embodiment of the present invention are applicable to all kinds of portable terminals including a bar type, a flip type, and a folder type, the following description is made of the wide keypad and the wide keypad structure in the context of a bar type terminal by way of example.

Figure 1:
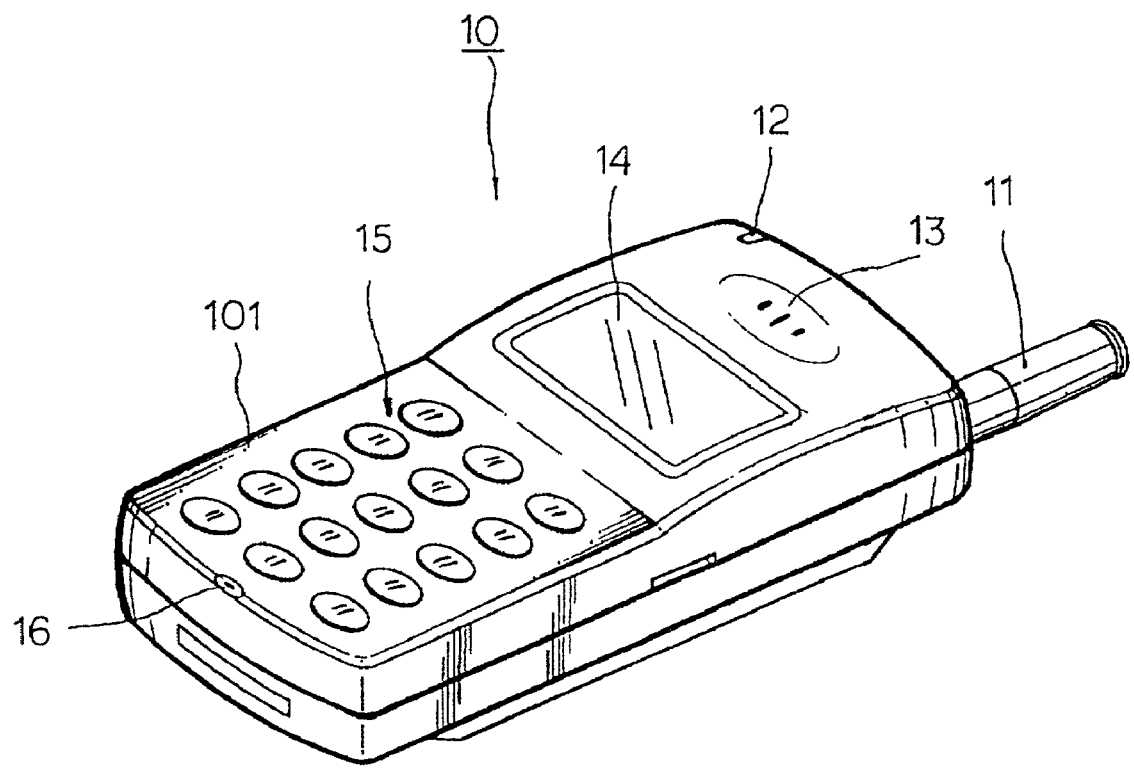
FIG. 1 is a perspective view of a conventional terminal with a keypad.
Figure 2:
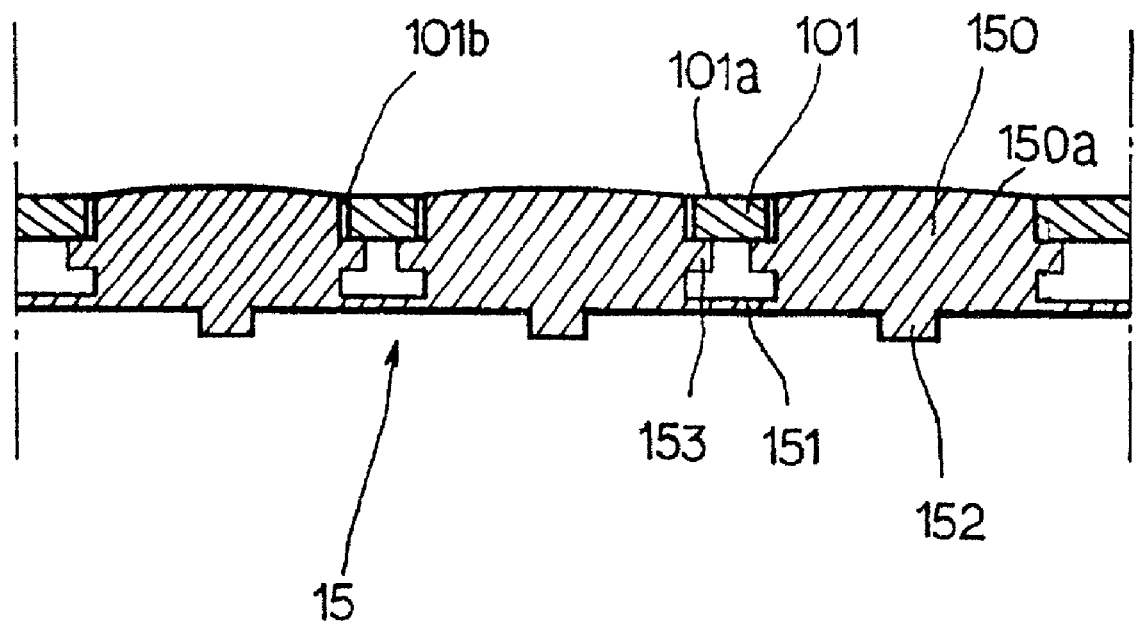
FIG. 2 is a sectional view of the keypad and a keypad mounting structure in the conventional terminal.
Figure 3:
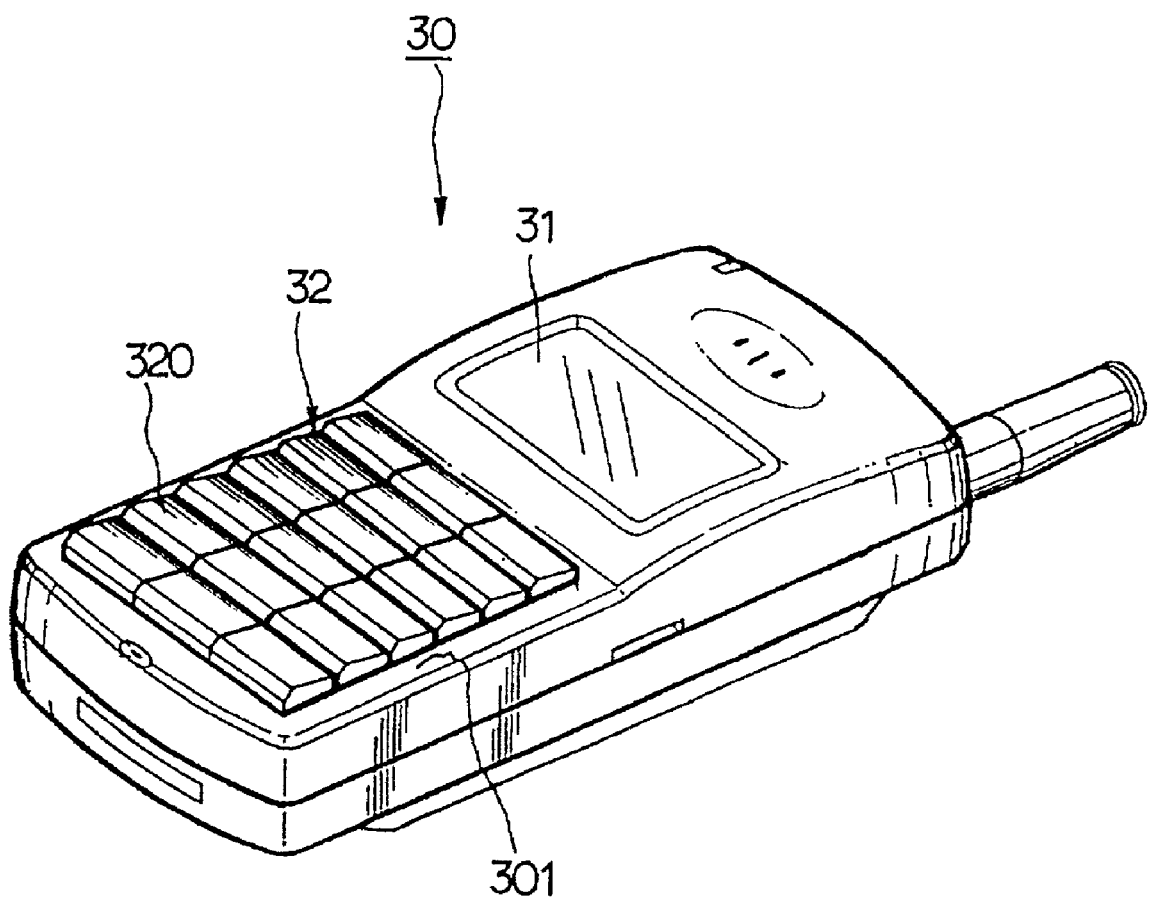
FIG. 3 is a perspective view of a terminal with a wide keypad according to an embodiment of the present invention.

FIG. 3 is a perspective view of a terminal with a wide keypad according to an embodiment of the present invention. While a wide keypad 32 is disposed in a lower part of a main body 30 in the drawing, it is a mere example. For example, the positions of the wide keypad 32 and an LCD 31 can be exchanged on the main body 30. A plurality of key tops 320 are tightly arranged in a matrix in the wide keypad 32. The top ends of the key tops 320 in the wide keypad 32 can be even with, lower than, or higher than the surface of an upper casing frame 301. In FIG. 1, the top ends of the key tops 320 are shown to be lower than the surface of the upper casing frame 301. The key tops 320 are arranged in so tight contact with each other that there exists only a gap enough to move down keys.

Figure 4:
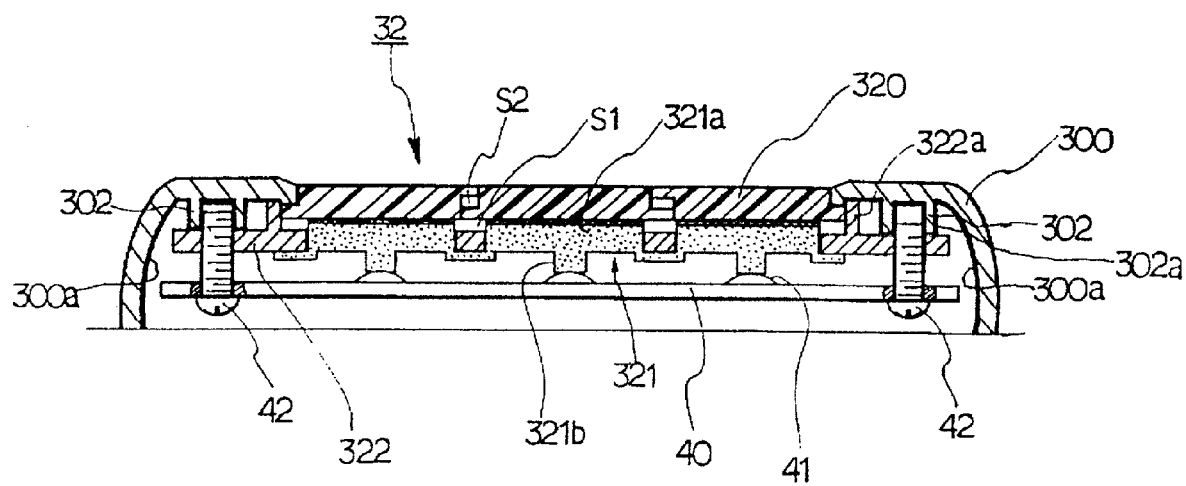
FIG. 4 is a sectional view of the wide keypad and a wide keypad mounting structure in the terminal shown in FIG. 3.
Figure 5:
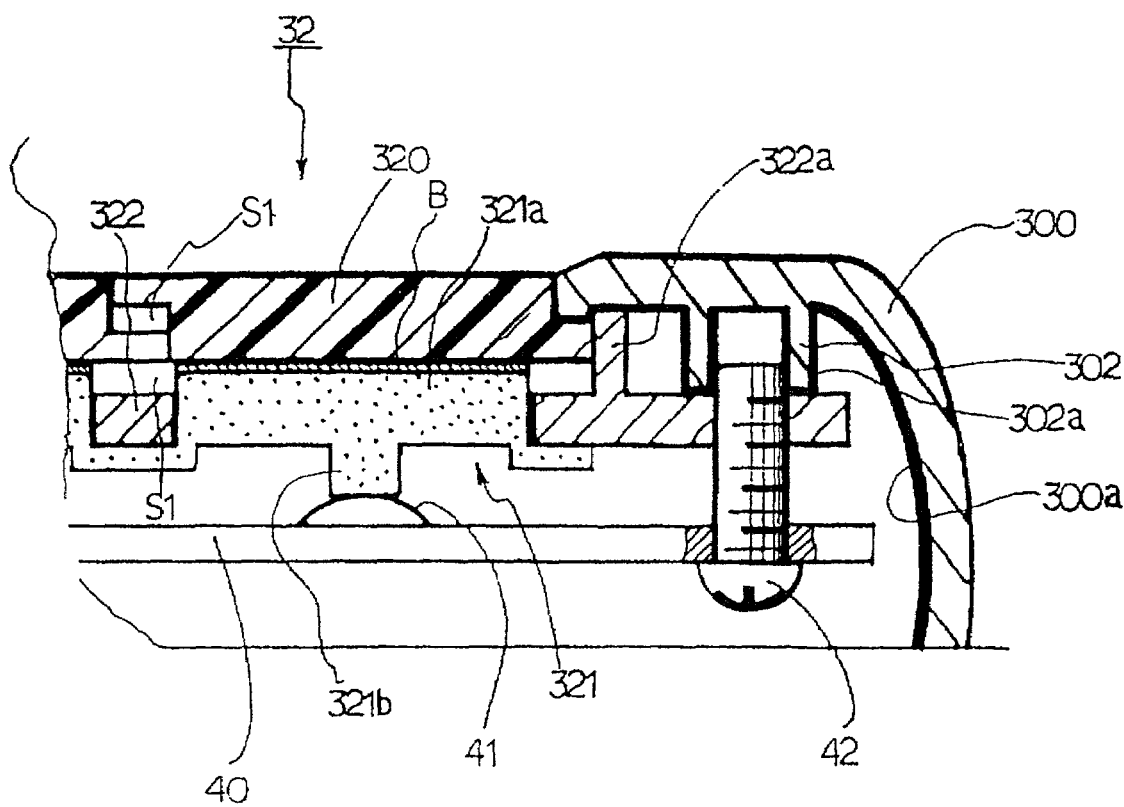
FIG. 5 is a partial enlarged view of the keypad and the wide keypad structure shown in FIG. 4.

Referring to FIGS. 4 and 5, the wide keypad and the wide keypad mounting structure according to the present invention will be described.

Referring to FIG. 4, the wide keypad 32 includes the key tops 320 arranged in tight contact, a key film 321 of a silicon rubber bonded under the key tops 320, and a key frame 322 inserted into the key film 321 to support the key tops 320 and regulate the vertical movements of the key tops 320.

The top ends of the key tops 320 are exposed to be touched by a user and the bottom ends of the key tops 320 are bonded with the key film 321 within the upper casing frame 300. The key film 321 has upper protrusions 321a to be bonded to the bottom ends of the key tops 320, lower contact point portions 321b spaced from or in contact with metal domes 41, and recesses S1 between the upper protrusions 321a. The key frame 322 has a plurality of holes and inserted into the recesses S1. The key frame 322 also has a spacer 322a to vertically space the key frame 322 from the upper casing frame 300. The spacer 322a is extended erectly upward from the key frame 322 and the end of the spacer 322a contacts the inner surface 300a of the upper casing frame 300.

When the user presses the top end of a key top 320 to enter data, the key top 320 moves down, pressing a metal dome 41. Thus, the carbon contact point of the metal dome 41 is brought into contact with a carbon contact point of a main board 40, thereby generating a signal. With the force removed from the key top 320, the key top 320 returns to its original position by the elasticity of the metal dome 41 and the key film 321.

Referring to FIG. 5, the inner surface of 300a of the upper casing frame 300 is treated with a conductive material, particularly copper by spray or coating. A conductive material is sprayed with the surface 302a of an engaging boss 302 extended downward from the inner surface 300a of the upper casing frame 300. The key frame 322 is formed of a conductive material by die casting.

Therefore, by engaging the wide keypad 32 with the boss 302 of the upper casing frame 300 by a screw 42, contact is made among the main board 40, the screw 42, the key frame 322, the inner surface 300a of the upper casing frame 300, and the spacer 322a at at least one position in each of those components. For example, static electricity introduced via the gap between key tops 320 is grounded to the inner surface 300a of the upper casing frame 300 via the key frame 322 and the spacer 322a or via the key frame 322, the screw 42, and the boss 302. Static electricity generated from the main board 40 is grounded to the inner surface 300a of the upper casing frame 300 via the screw 42 and the surface 302a of the boss 302. Reference character B denotes a bonding layer resulting from bonding the bottom ends of the key tops 320 and the upper protrusions 321a of the key film 321.

Instead of the spacer 322a, the boss 302 is so configured as to provide space in which the key tops move up and down. The key tops 320 are formed of a conductive material and the side surface of a key top 320 contacts the spacer 322a in order to minimize externally introduced static electricity.

Consequently, three grounding paths for preventing ESD are established: the key top 320, the spacer 322a, and the inner surface 300a of the upper casing frame 300; the key frame 322, the spacer 322a, and the inner surface 300a of the upper casing frame 300; and the key frame 322, the screw 42, the boss 302, and the inner surface 300a of the upper casing frame 300. In addition, static electricity generated from the main board 40 with circuits and chips formed thereon is grounded to the inner surface 300a of the upper casing frame 300 via the screw 42 and the boss 302.

In accordance with the present invention as described above, key tops are arranged in tight contact with each other. Therefore, the present invention exhibits the advantages of increased key size, convenient key pressing, miniaturization of a main body, and grounding of externally introduced static electricity.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A wide keypad in an upper casing frame of a portable terminal, comprising:
   a plurality of key tops arranged in tight contact in a matrix of rows and columns;
   a key film having a plurality of upper protrusions in contact with bottom surfaces of the key tops, a plurality of lower protrusions as contact points spaced from metal domes, and recesses between the upper protrusions; and
   a key frame inserted into the recesses of the key film and having at least one spacer extended upward for providing space in which the key tops move up and down between the upper casing frame and the key film.

2. The wide keypad of claim 1, wherein the key frame is fabricated by die casting.

3. The wide keypad of claim 1, wherein the spacer is erect and symmetrical.

4. A wide keypad mounting structure for preventing ESD (ElectroStatic Discharge) in a portable terminal, comprising:
   an upper casing frame having an inner surface treated with a conductive material;
   a plurality of key tops fixed in tight contact with each other in a matrix of rows and columns within the upper casing frame;
   a key film having a plurality of upper protrusions in contact with bottom surfaces of the key tops, a plurality of lower protrusions as contact points spaced from metal domes, and recesses between the upper protrusions, and bonded to the bottom surfaces of the key tops;

a conductive key frame inserted into the recesses of the key film and having at least one spacer extended upward for providing space in which the key tops move up and down between the upper casing frame and the key film; and an engaging boss extended from a predetermined portion of the bottom surface of the upper casing frame to be engaged with a main board by a screw, the surface of the engaging boss being treated with a conductive material to contact the key frame.

5. The wide keypad mounting structure of claim 4, wherein the end of the spacer contacts the inner surface of the upper casing frame.

6. The wide keypad mounting structure of claim 4, wherein the key tops are formed of a conductive material.

7. The wide keypad mounting structure of claim 4, wherein the side surface of a key top contacts the spacer.

* * * * *